United States Patent
Lenker et al.

(10) Patent No.: US 10,312,900 B2
(45) Date of Patent: Jun. 4, 2019

(54) SWITCHING DEVICE FOR OPERATING AT LEAST ONE LOAD

(71) Applicant: Woehner GmbH & Co. KG Elektrotechnische Systeme, Roedental (DE)

(72) Inventors: Hubert Lenker, Sonneberg (DE); Philipp Steinberger, Coburg (DE)

(73) Assignee: Woehner GmbH & Co. KG Elektrotechnische Systeme, Reodental (DE)

( * ) Notice: Subject to any disclaimer, the term of this patent is extended or adjusted under 35 U.S.C. 154(b) by 48 days.

(21) Appl. No.: 15/556,032

(22) PCT Filed: Feb. 22, 2016

(86) PCT No.: PCT/EP2016/053688
§ 371 (c)(1),
(2) Date: Sep. 6, 2017

(87) PCT Pub. No.: WO2016/142163
PCT Pub. Date: Sep. 15, 2016

(65) Prior Publication Data
US 2018/0048303 A1     Feb. 15, 2018

(30) Foreign Application Priority Data
Mar. 6, 2015    (EP) ..................... 15157944

(51) Int. Cl.
*H02J 3/14*     (2006.01)
*H03K 17/13*    (2006.01)
(Continued)

(52) U.S. Cl.
CPC ............ *H03K 17/13* (2013.01); *G01R 25/00* (2013.01); *H01H 9/542* (2013.01); *H01H 9/56* (2013.01);
(Continued)

(58) Field of Classification Search
None
See application file for complete search history.

(56) References Cited

U.S. PATENT DOCUMENTS

| 4,356,525 A * | 10/1982 | Kornrumpf ............ H01H 9/542 361/13 |
| 2016/0065090 A1 * | 3/2016 | Dent ....................... H02M 7/54 363/102 |

FOREIGN PATENT DOCUMENTS

| DE | 3151839 | 8/1982 |
| DE | 3317964 | 11/1984 |
| WO | 2007014725 | 2/2007 |

OTHER PUBLICATIONS

International Search Report corresponding to International Application No. PCT/EP2016/053688, dated Apr. 11, 2016 (10 pages).

* cited by examiner

*Primary Examiner* — Lincoln D Donovan
*Assistant Examiner* — Khareem E Almo
(74) *Attorney, Agent, or Firm* — Maginot, Moore & Beck, LLP

(57) ABSTRACT

Switching device (1) for operating at least one load, comprising at least one switching unit (7; 8; 9), which switches a tapped current phase (L) to a load (2-1; 2-2; 2-3) connectable to the switching unit (7; 8; 9) to supply said load with current and which has a measurement unit (7C; 8C; 9C) which measures a current phase progression of the at least one current phase (L); a local control unit (18), which after receiving a control command from an external control system (24) actuates a semiconductor switch (7B; 8B; 9B) of the switching unit (7; 8; 9) in such a way that the semiconductor switch (7B; 8B; 9B) switches at a zero of the current phase (L) measured by the measurement unit (7C; 8C; 9C), and a local monitoring unit (20), which evaluates the current
(Continued)

phase progression, measured by the measurement unit (7C; 8C; 9C), of the at least one current phase (L) to detect an operational deviation from a normal current supply to the associated load (2-1; 2-2; 2-3) connected to the switching unit (7; 8; 9), and reports any detected operational deviation.

22 Claims, 7 Drawing Sheets

(51) Int. Cl.
     *H01H 9/54*          (2006.01)
     *G01R 25/00*        (2006.01)
     *H01H 9/56*          (2006.01)
     *H01H 9/00*          (2006.01)
     *H01H 9/10*          (2006.01)
     *H01H 11/00*        (2006.01)
     *H01H 47/00*        (2006.01)
     *H01H 47/18*        (2006.01)
(52) U.S. Cl.
     CPC ............ *H01H 9/0072* (2013.01); *H01H 9/10* (2013.01); *H01H 9/563* (2013.01); *H01H 11/0062* (2013.01); *H01H 47/002* (2013.01); *H01H 47/18* (2013.01); *H01H 2009/545* (2013.01); *H01H 2011/0068* (2013.01)

SWITCHING DEVICE FOR OPERATING AT LEAST ONE LOAD

This application is a 35 U.S.C. 371 National Stage application of PCT/EP2016/053688, filed Feb. 22, 2016, and claims priority to European Application No. EP 15157944.8, filed on Mar. 6, 2016. The entire contents of the above-mentioned patent applications are incorporated herein by reference as part of the disclosure of this U.S. application.

The invention relates to a switching device for operating loads which are connected to a rail system, and in particular for switching loads which are switched frequently each day.

A rail system, for example a busbar system, comprises a plurality of busbars, usually arranged parallel, which conduct different current phases (L). In many applications, it is necessary to switch loads, in particular ohmic loads, on and off frequently, for example up to 20,000 times a day. For this purpose, solid-state relays having an electrical pre-fuse are conventionally often used for switching the loads onto the busbar system. In this context, these conventional solid-state relays are wired individually on a rail adapter.

This conventional switching arrangement has various drawbacks. As a result of the solid-state relays being wired individually, assembly is relatively complex and requires a relatively large amount of assembly space. A further drawback is the relatively high electrical power loss brought about by the solid-state relays used.

Therefore, an object of the present invention is to provide a switching device for operating loads which on the one hand makes simple assembly possible and on the other hand provides a reliable current supply to loads.

This object is achieved according to the invention by a switching device having the features set out in claim 1.

The invention accordingly provides a switching device for operating at least one load comprising at least one switching unit, which switches a tapped current phase to a load connectable to the switching unit to supply said load with current and which has a measurement unit which measures a current phase progression of the at least one current phase, a local control unit which, after receiving a control command from an external control system, actuates a semiconductor switch of the switching unit in such a way that the semiconductor switch switches at a zero of the current phase measured by the measurement unit, and comprising a local monitoring unit, which evaluates the current phase progression, measured by the measurement unit, of the at least one current phase to detect an operational deviation from a normal current supply to the associated load connected to the switching unit, and reports any detected operational deviation.

In one possible embodiment, the switching device comprises at least one current phase monitoring unit which monitors the progression over time of at least one tapped current phase of the busbar system.

In one possible embodiment of the switching device according to the invention, the current phase monitoring unit of the switching device detects a zero of the associated tapped current phase and reports this to the local control system of the switching device.

In a further possible embodiment of the switching device according to the invention, the switching device comprises at least one error detection unit or monitoring unit, which monitors whether the tapped current phase has been switched by the switching unit of the switching device in accordance with the control command received from the local control system.

In a further possible embodiment of the switching device according to the invention, the local monitoring unit detects a switching error which has occurred and reports it to the local control system of the switching device.

In a further possible embodiment of the switching device according to the invention, the local control system of the switching device passes a switching error reported thereby to the external control system via a control interface.

In a further possible embodiment of the switching device according to the invention, the tapped current phase is passed to the hybrid circuit via a fuse, in particular a replaceable safety fuse.

In a further possible embodiment of the switching device according to the invention, if a switching error occurs the error detection unit of the switching device detects the type of the switching error which has occurred.

In a further possible embodiment of the switching device according to the invention, the monitoring unit detects whether the switching error which has occurred is caused by a failure of a tapped current phase or by a continuous current outputted by the switching unit.

In a further possible embodiment of the switching device according to the invention, the monitoring unit reports the type of the switching error which has occurred to the local control system of the switching device.

In a further possible embodiment of the switching device according to the invention, the local control system of the switching device passes the type reported thereby of the switching error which has occurred onwards to the external control system via a control interface.

In a further possible embodiment of the switching device according to the invention, the external control system evaluates the switching error reported thereto by the local control system of the switching device and/or the type of said error, and drives the loads connected to the switching device in accordance with the evaluation result.

In a further possible embodiment of the switching device according to the invention, the switching device comprises at least one temperature sensor which monitors an internal temperature, in particular a temperature of the at least one switching unit, and reports this temperature to the local control system of the switching device.

In a further possible embodiment of the switching device according to the invention, the control interface of the switching device is connected to the external control system via an optical coupler.

In a further possible embodiment of the switching device according to the invention, the mechanical switch of the switching unit formed as a hybrid circuit comprises a relay.

In a further possible embodiment of the switching device according to the invention, the semiconductor switch of the switching unit formed as a hybrid circuit comprises a triac.

In a further possible embodiment of the switching device according to the invention, the switching device comprises three switching units for three tapped current phases, which are formed as hybrid circuits and each comprise a mechanical relay and a triac connected in parallel therewith.

In a further possible embodiment of the switching device according to the invention, the entire switching device is integrated into an appliance housing.

In an alternative embodiment of the switching device according to the invention, a switching unit and an associated local control system are integrated into each appliance housing.

In a further possible embodiment of the switching device according to the invention, the appliance housing of the switching device comprises a rail contact system for each current phase.

In a further possible embodiment of the switching device according to the invention, the external control system is connectable to the at least one local control system of the switching device via a plug-in connection.

In a further possible embodiment of the switching device according to the invention, the at least one load is connectable to a switching unit of the switching device via a plug-in connection.

In a further possible embodiment of the switching device according to the invention, the switching device is operated in a manner synchronised with a current distribution network.

In one possible embodiment, the switching device comprises a reversal stage.

In one possible embodiment, the switching device is mountable on a top hat rail or a mounting plate.

The invention further provides a rail system having the features set out in claim 21.

The invention accordingly provides a rail system comprising a plurality of rails for current phases and comprising at least one switching device for operating at least one load comprising at least one switching unit, which switches a tapped current phase to a load connectable to the switching unit to supply said load with current and which has a measurement unit which measures a current phase progression of the at least one current phase, a local control unit, which after receiving a control command from an external control system actuates a semiconductor switch of the switching unit in such a way that the semiconductor switch switches at a zero of the current phase measured by the measurement unit, and comprising a local monitoring unit, which evaluates the current phase progression, measured by the measurement unit, of the at least one current phase to detect an operational deviation from a normal current supply to the associated load connected to the switching unit, and reports any detected operational deviation.

In the following, possible embodiments of the switching device according to the invention for operating loads are described in greater detail with reference to the accompanying drawings, in which.

Figure 1A:
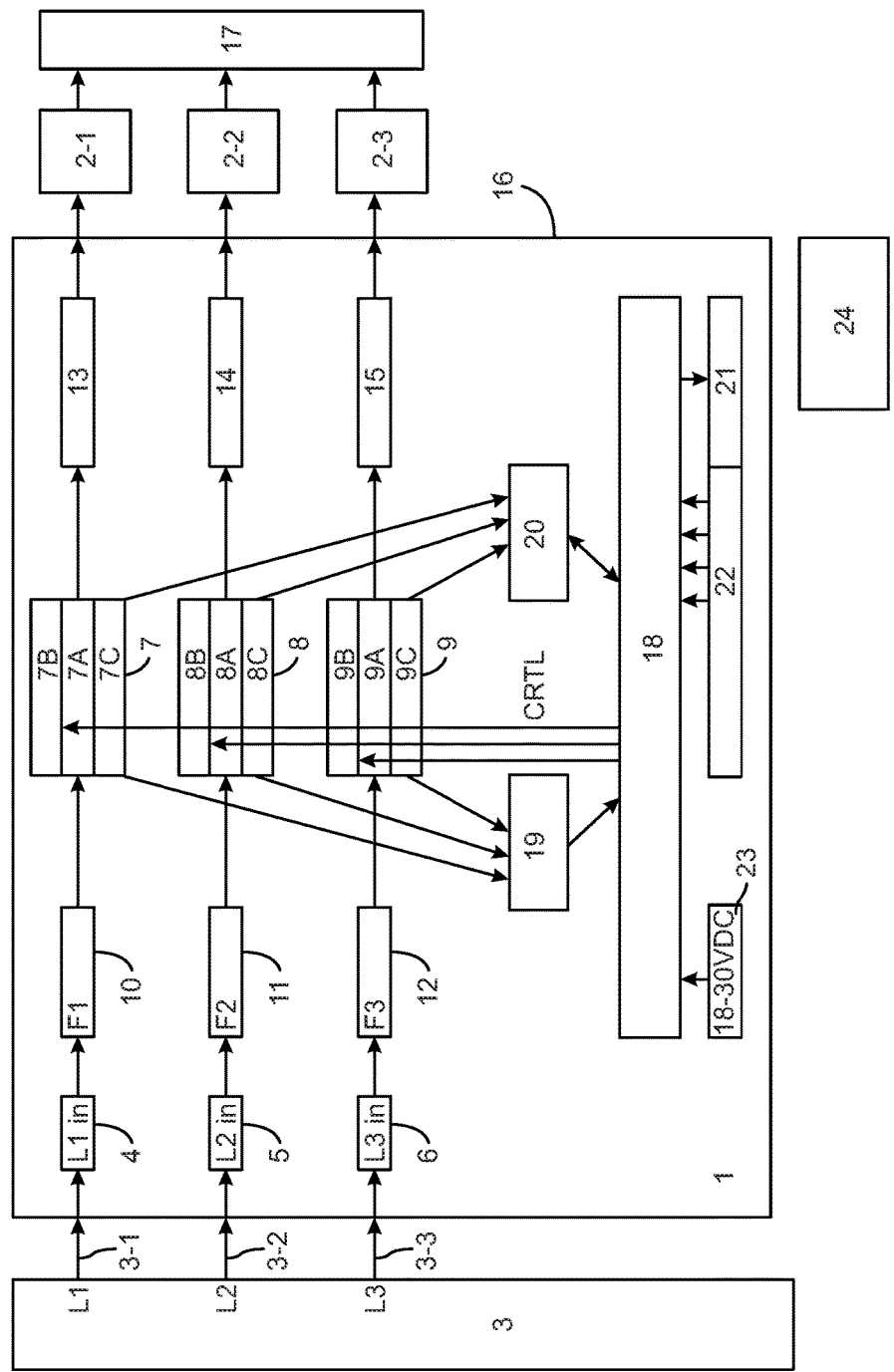
FIGS. 1A, 1B, 1C are block diagrams showing possible embodiments of a switching device according to the invention for switching loads to a rail system.
Figure 1B:
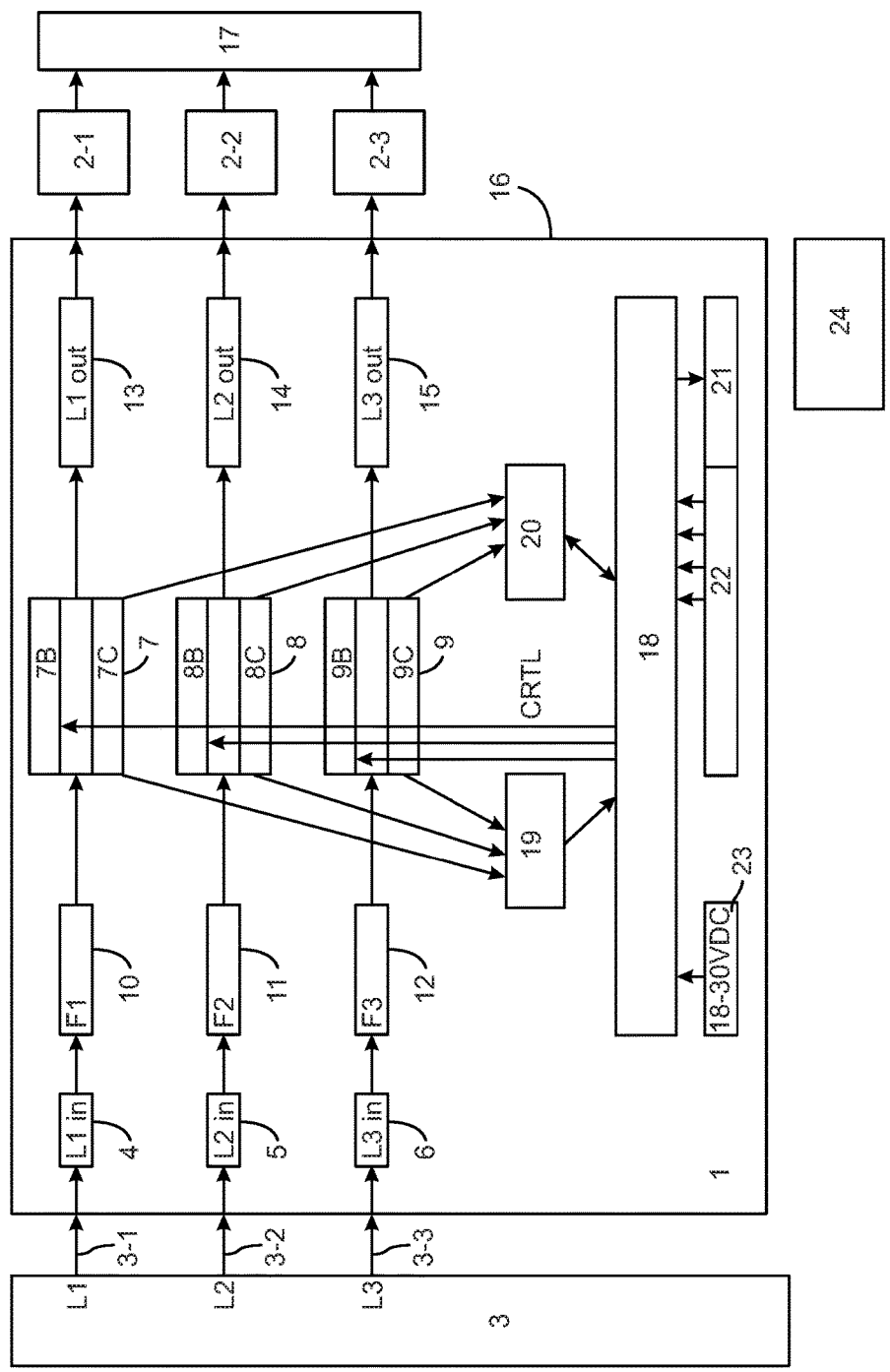

FIGS. 1A, 1B show two possible embodiments of a switching device according to the invention. In both embodiments, the switching device 1 comprises an associated switching unit 7, 8, 9 for each switching phase L. These are connected at the input side to electric phase connection contacts 4, 5, 6 via safety fuses 10, 11, 12. In the first embodiment shown in FIG. 1A, each of the switching units 7, 8, 9 is formed by a hybrid switching arrangement. In this context, each hybrid switching arrangement comprises a mechanical switch 7A, 8A, 9A and a semiconductor switch 7B, 8B, 9B connected in parallel therewith. In the second embodiment shown in FIG. 1B, each switching unit 7, 8, 9 has a semiconductor switch 7B, 8B, 9B. In both of the embodiments shown in FIGS. 1A, 1B, the switching units 7, 8, 9 each have a measurement unit 7C, 8C, 9C. The switching units 7, 8, 9 of the switching device 1 switch a tapped current phase L to a load 2-1, 2-2, 2-3 connectable to the associated switching unit, as is shown in FIGS. 1A, 1B. Further, each switching unit 7, 8, 9, has a measurement unit 7C, 8C, 9C, which measures a current phase progression L(t) for at least one current phase L. In this context, in one possible embodiment, the measurement units 7C, 8C, 9C may each be formed by a GMR sensor. Alternatively, the measurement units 7C, 8C, 9C each have Rogowski coils, transformers, Hall sensors or shunt measurement resistors. The switching device 1 comprises a local control unit 18, which after receiving a control command from an external control system 24 actuates a semiconductor switch 7B, 8B, 9B of the switching unit 7, 8, 9 in such a way that the semiconductor switch switches at a zero or temporally close to a zero (L(t)=0) of the current phase L(t) measured by the associated measurement unit 7C, 8C, 9C. The switching device 1 comprises a local monitoring unit 20, as shown in FIGS. 1A, 1B. The local monitoring unit 20 evaluates the current phase progression L(t), measured by the measurement unit 7C, 8C, 9C, of the at least one current phase L to detect an operational deviation from a normal current supply to the associated load 2-1, 2-2, 2-3 connected to the switching unit, 7, 8, 9. The local monitoring unit 20 preferably reports any operational deviation detected thereby to the local control unit 18 and/or to the external control system 24. The normal current supply to a load 2-i connected to the switching unit 7, 8, 9 is generally a sinusoidal current phase having a preset power frequency f of for example 50 or 60 Hz at a preset or predetermined current amplitude. If there is a deviation from this normal current supply, the local monitoring unit 20 detects this and preferably reports this to the local control unit 18 which is integrated into the switching device 1 and/or to an external control system 24 via an interface of the switching device 1.

FIG. 1A is a schematic block diagram of an example embodiment of a switching device 1 according to the invention for switching at least one load 2 to a current phase L of a rail system 3 or of a top hat rail adapter. In the embodiment shown in FIG. 1, the rail system 3 comprises three current phases L1, L2, L3. In one possible embodiment, the rail system 3 is a busbar system comprising a plurality of busbars. The rail system 3 may also comprise a top hat rail for mechanical fastening and further electrical rails or lines for the current phases L1, L2, L3. The switching device 1 may also be contained in a busbar adapter. A rail, in other words a busbar or another rail, is provided for each current phase L1, L2, L3. An associated rail contact system 4, 5, 6 is provided for each current phase L1, L2, L3, as is shown in FIG. 1A. In the embodiment shown, the switching device 1 comprises a switching unit 7, 8, 9 for each tapped current phase L. Preferably, a fuse element, preferably a replaceable safety fuse, is provided between each rail contact 4, 5, 6 and the associated switching unit 7, 8, 9, as is shown in FIG. 1A. These have for example a current threshold of 20 amps. Each switching unit 7, 8, 9 is connected at the output to a phase output terminal 13, 14, 15, to which a load 2-1, 2-2, 2-3 respectively is connectable. Preferably, the loads 2-1, 2-2, 2-3 are connectable to the switching device 1 integrated into a housing 16 via a plug-in connection. The loads 2-1, 2-2, 2-3 are preferably connected at the output to a neutral conductor 17. In one possible embodiment, the loads 2-i are ohmic loads. Alternatively, the loads 2-1 may also comprise capacitive and/or inductive loads. The loads 2-i are for example lighting units, heating units or motor units.

The various switching units 7, 8, 9 are each configured to switch a current phase L1, L2, L3 tapped from a current-carrying rail of the rail system 3 to a load 2-1, 2-2, 2-3 which is connectable to the switching unit. In one possible embodiment, the switching units 7, 8, 9 are each formed by a hybrid circuit. Each hybrid circuit 7, 8, 9 comprises a mechanical switch 7A, 8A, 9A and a semiconductor switch 7B, 8B, 9B connected in parallel therewith. In one possible embodiment, each mechanical switch 7A, 8A, 9A is a relay or switching relay. The semiconductor switch 7B, 8B, 9B connected in parallel therewith is preferably a triac. In the embodiment shown in FIG. 1A, the various switching units 7, 8, 9 are integrated into or contained in a housing 16 or the switching device 1. Alternatively, the various switching units 7, 8, 9 may also be integrated into different housings.

The switching device 1 comprises a local control system 18, which after receiving a control command from an external control system actuates mechanical switches and/or semiconductor switches of the various switching units 7, 8, 9 in such a way that they each switch during a zero of the tapped current phase L or temporally as close as possible to a zero. In the embodiment shown in FIG. 1A, the switching device 1 has hybrid circuits as switching units 7, 8, 9, which each comprise a current measurement unit 7C, 8C, 9C which monitors the progression over time of the associated tapped current phase L. The current measurement unit 7C, 8C, 9C of each switching unit 7, 8, 9 detects a zero of the associated tapped current phase L1, L2, L3 and reports this zero to the local control system 18 of the switching device 1. Alternatively, a measurement device may be provided which is connected to an integrated current monitoring unit 19, the measurement device monitoring all current phases L and reporting detected zeros to the local control system 18 of the switching device 1.

In one possible embodiment, the switching device 1 further comprises a local monitoring unit or error detection unit 20, which monitors whether the tapped current phase L has actually and without error been switched by the associated switching unit 7, 8, 9 in accordance with the control command received by the local control system 18 from an external control system 24. This provides verification that the issued control commands have actually been implemented by the switching device 1. The local monitoring unit 20 evaluates the current phase progression L(t), measured by the measurement unit 7C, 8C, 9C, of the corresponding current phase L to detect an operational deviation from a normal current supply to the associated load 2 connected to the switching unit 7, 8, 9. The local monitoring unit 20 can report any detected operational deviation from the normal current supply to the local control system 18 and/or the external control system 24. The current monitoring unit 19 and/or the local monitoring unit 20 or error detection unit 20 may be integrated into the local control system 18. The local control system 18 preferably carries out continuous verification as to whether switching tasks are being implemented correctly or without error by the switching units 7, 8, 9 in accordance with the control commands received from the external control system 24. The local monitoring unit 20 detects whether a current phase L is failing upstream or downstream from the appliance or the switching device 1. It can further be detected whether there is a shorted semiconductor 7B, 8B, 9B or a stuck mechanical contact 7A, 8A, 9A. In one possible embodiment, the monitoring unit 20 detects a switching error which has occurred and reports it to the local control system 18 of the switching device 1. In one possible embodiment, the local control system 18 passes the switching error onwards to the external control system 24 via a control interface 21. In a further possible embodiment, the local control system 18 receives control commands from the external control system 24 via control inputs 22 or via a further control interface. In one possible embodiment, the external control system 24 is connected or plugged to the switching device 1 directly or via a control bus via a plug-in connection. In one possible embodiment, the switching device 1 additionally has an integrated current supply 23 for supplying the electronic switching components integrated into it, in particular the integrated local control system 18, with current.

In one possible embodiment, if a switching error occurs the monitoring unit 20 detects the type of the switching error which has occurred. The monitoring unit 20 detects a possible current failure, for example due to a phase failure or due to a triggered safety fuse, and an unintended continuous current, for example if a semiconductor switch 7B, 8B, 9B is shorted or a mechanical relay 7A, 8A, 9A is fused. This error type or error cause is preferably reported by the monitoring unit 20 to the internal control system 18 of the switching device 1. In one possible embodiment, the internal or local control system 18 of the switching device 1 generates a corresponding error message and outputs this error message to the external control system 24 via the control interface 21. The external control system 24 is connected directly or indirectly to the control interface 21. The external control system 24 may for example be a stored-program control system, SPC, of a machine or appliance. In one possible embodiment, the control interface 21 of the switching device 1 is connected to the external control system 24 via an optical coupler. The external control system 24 on the one hand passes control commands to the internal control system 18 via the control interface 21 and on the other hand receives error messages from the local control system 18. In one possible embodiment, the external control system 24 evaluates the switching commands reported by the local control system 18 of the switching device 1 and actuates the loads 2-i connected to the switching device 1 in accordance with the evaluation result. In the evaluation, in one possible embodiment the external control system 24 also additionally takes into account information relating to the loads 2-i connected to the switching device 1. If a switching error occurs, the external control system 24 decides, preferably by way of the presumed error cause or the type of reported error message and on the basis of the loads 2-i connected to the switching device 1, whether the switching error which has occurred is a critical switching error or a non-critical switching error. In one possible embodiment, if a critical switching error occurs, the corresponding load 2-i is shut down or switched off. Conversely, if a non-critical switching error is involved, in one embodiment the corresponding load 2-i can initially continue to be operated. In one possible embodiment, the switching device 1 according to the invention has a display device connected to the internal control system 18 or an LED display or the like. If a switching error occurs, in particular a critical switching error, the occurrence of the switching error is displayed to a user by way of the display device. If a critical switching error occurs, the corresponding load 2-*i* is preferably switched off or shut down as rapidly as possible, directly or indirectly, and can subsequently be replaced.

FIG. 1B shows a further possible embodiment of the switching device 1 according to the invention. In the embodiment shown in FIG. 1B, each switching unit 7, 8, 9 comprises a semiconductor switch 7B, 8B, 9B and a measurement unit 7C, 8C, 9C. The semiconductor switches 7B, 8B, 9B are each actuated by the local control system 18 of the switching device 1. The measurement units 7C, 8C, 9C deliver measurement signals to the current monitoring unit 19 and the local monitoring unit 20, as is shown in FIG. 1B. The semiconductor switches 7B, 8B, 9B are each connected between safety fuses 10, 11, 12 and phase output terminals 13, 14, 15 of the switching device 1. The remaining units or components correspond to the units or components of the embodiment shown in FIG. 1A.

Figure 1C:
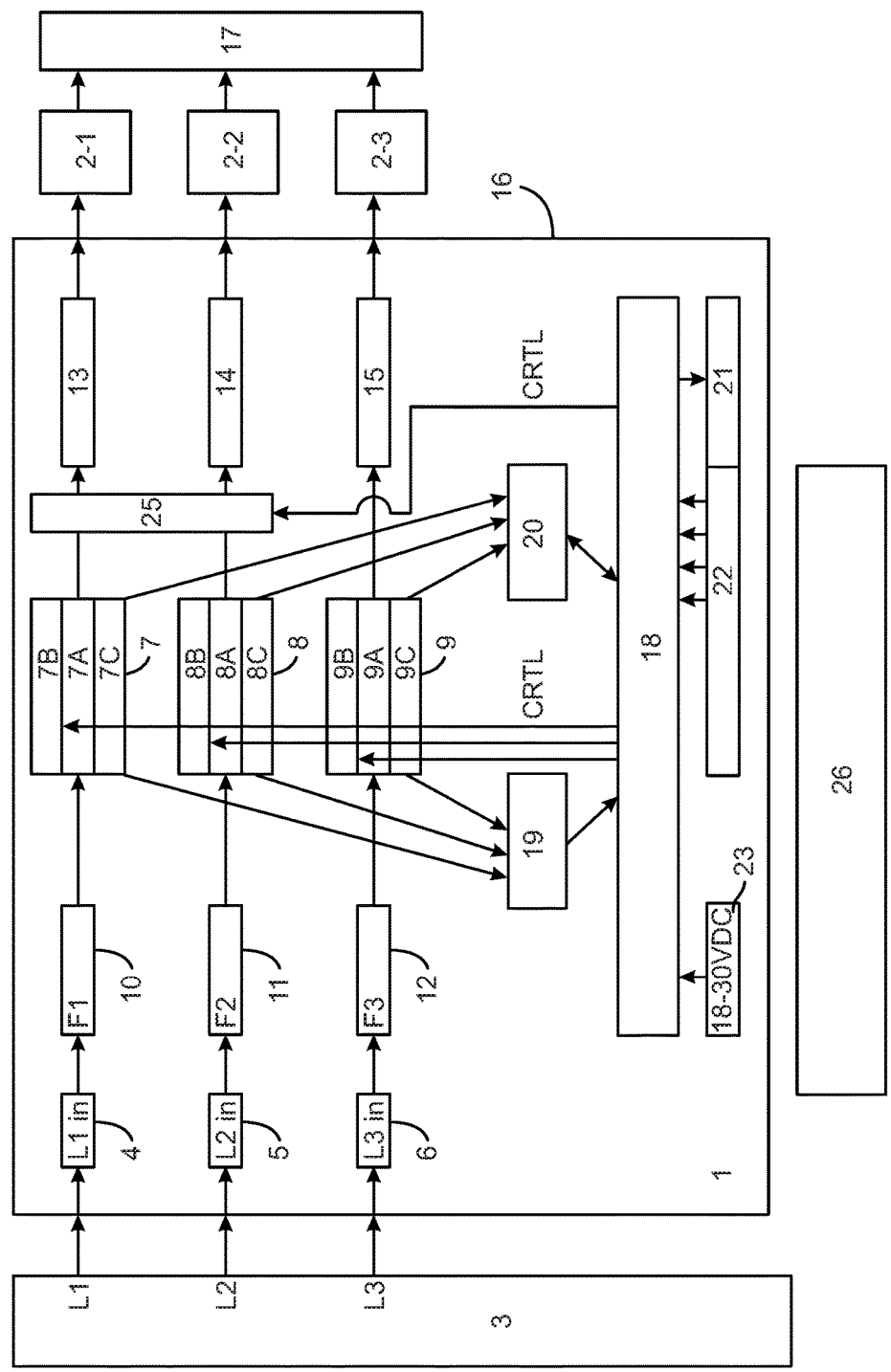

The connected loads 2-*i*, which are shown in FIGS. 1A, 1B, 1C, may comprise various loads 2-*i*, for example motor device, ventilation devices or lighting devices. In one possible embodiment, the loads 2-*i* are tool units, for example heating devices of the manufacturing equipment, for example in the food industry or in plastics material processing. In a further possible embodiment of the switching device 1 according to the invention, it comprises one or more temperature sensors, which can be attached inside the housing 16. In one possible embodiment, these temperature sensors measure the internal temperature, in particular the temperature T of the various switching units 7, 8, 9. In one possible embodiment, the measured temperatures T are signalled to the internal control system 18. In the embodiments shown in FIG. 1A, 1B, 1C, the three switching units 7, 8, 9 and the associated fuses 10, 11, 12 and the internal control system 18 are integrated into a housing 16. In an alternative embodiment, the switching units 7, 8, 9 and the associated fuses 10, 11, 12 thereof may each be integrated into a separate appliance housing and have a dedicated internal control system.

The switching device 1 is preferably synchronised with a power network which has a preset power frequency of 45 Hz to 65 Hz. The switching commands issued and received at any given time are preferably delayed for a short time, in such a way that a switching process takes place at as favourable a time as possible, close to the zero of the tapped current phase. The time delay of the mechanical switch 7A, 8A, 9A, in particular relay, is preferably taken into account in switching the process control system on and off. The triac 7B, 8B, 9B, preferably connected in parallel with the mechanical switch or relay 7A, 8A, 9A, of the switching unit 7, 8, 9 ensures that product spread between different relays can be compensated and the corresponding relay always switches to be load-free. The duration and intensity of the flow of current I in the semiconductor switch or triac 7B, 8B, 9B are preferably kept as low as possible for an optimally set switching time. The power losses in the triac 7B, 8B, 9B only occur for a short time at a low electrical current.

In a preferred embodiment, the switching units 7, 8, 9 are formed by hybrid circuits, which each comprise a mechanical switch and a semiconductor switch connected in parallel therewith. In the hybrid circuits 7, 8, 9, in each case the semiconductor switches or triacs 7B, 8B, 9B take on the switching work and the mechanical switches or relays 7A, 8A, 9A take on the provision of a continuous current. During a switch-on process, the mechanical switch or relay 7A, 8A, 9A of the hybrid circuit or switching unit 7, 8, 9 is actuated at the optimum time, the mechanical switch 7A, 8A, 9A having a particular switching delay. Before the relay contact closes, the semiconductor switch or triac 7B, 8B, 9B is connected through. After the relay contact 7A, 8A, 9A is closed, the semiconductor switch or triac 7B, 8B, 9B is switched off. Thus, the switch-on process of the hybrid circuit which is actuated by the internal control system 18 is completed for the associated load 2.

In one possible embodiment, the switching device 1 comprises a reversal stage 25, as is shown in FIG. 1C. The reversal stage 25 may extend over two phases L1, L2, as shown in FIG. 1C, or alternatively over three phases L1, L2, L3. By means of the reversal stage 25, the direction of rotation can be reversed in the case of a motor as a load. The reversal stage 25 is preferably actuated by the internal control system 18.

Figure 2:
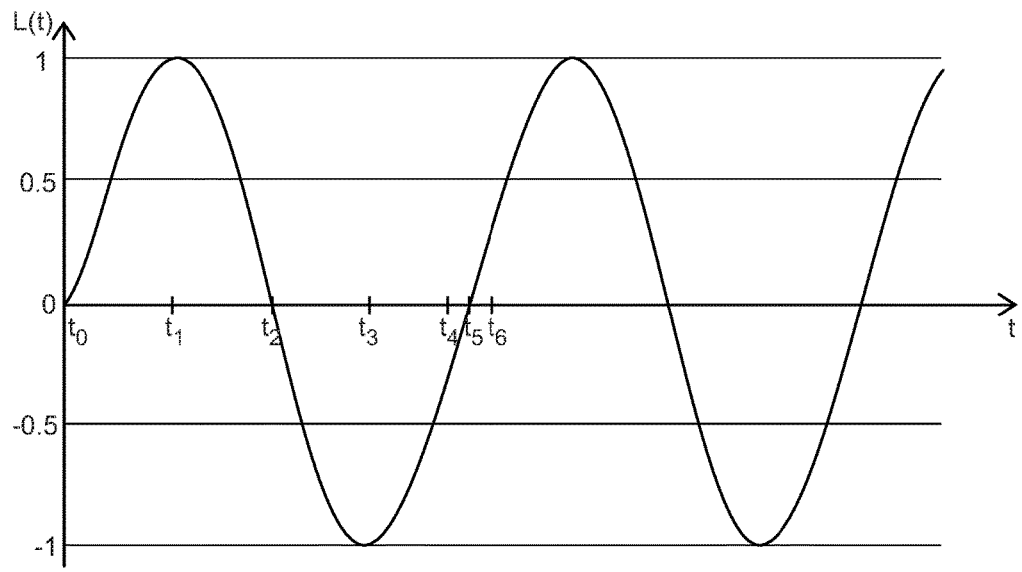
FIG. 2 is a signal diagram illustrating the mode of operation of the switching device according to the invention in a switch-on process.

FIG. 2 schematically shows a switch-on process in a switching unit 7, 8, 9, which is formed by a hybrid circuit, within the switching device 1 by way of a signal diagram of the relevant current phase L. The tapped current L has a sinusoidal progression over time, and has a preset frequency f of for example 50 Hz. At a time t1, the local control system 18 of the switching device 1 receives an external switch-on command by way of the external control system 24. In the example shown in FIG. 2, at the time t1 when the local control system 18 receives the control command, the remaining time until the next zero at the time t2 is too low, since too much power loss would occur in the semiconductor switch 7B, 8B, 9B of the hybrid circuit 7, 8, 9. Taking into account the preset switch-on delay of the mechanical switch or relay 7A, 8A, 9A, in the next half-wave of the tapped current phase L the relay 7A, 8A, 9A receives the switch-on command from the local control system 18 at the time t3. At the time t4, still before the next zero, the triac circuit 7B, 8B, 9B of the hybrid switching arrangement 7, 8, 9 receives the control command from the local control system 18.

From the time t5, temporally close to the zero of the tapped current phase L, to the time t6, the triac switch 7B, 8B, 9B and the corresponding mechanical switch or relay 7A, 8A, 9A are active simultaneously. From the time t6, the triac 7B, 8B, 9B can be shut down. By means of the triac 7B, 8B, 9B, the production spreads of the mechanical switch or relay 7A, 8A, 9A can be compensated. If there is sufficient time between the switch-on command and the next zero, the process takes place in such a way that switch-on occurs at the next zero.

Figure 3:
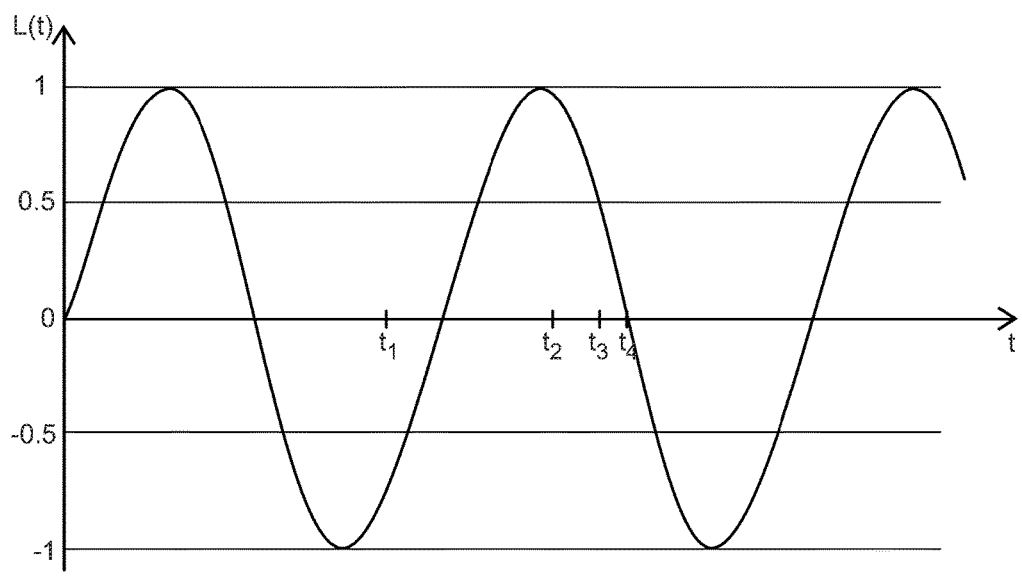
FIG. 3 is a signal diagram illustrating the mode of operation of the embodiment of the switching device according to the invention in a switch-off process.

FIG. 3 is a signal diagram of a tapped current phase L, schematically showing a switch-off process carried out by a switching unit 7, 8, 9, formed as a hybrid circuit, of the switching device 1. The mechanical switches or relays 7A, 8A, 9A of the hybrid switching arrangement 7, 8, 9 are initially in the on state. At the time t1, the internal control system 18 of the switching device 1 receives a switch-off command to switch off or block the hybrid circuit, provided for the current phase L, of the external control system. In the example shown, the time until the next zero of the tapped phase L is too low, since too much power loss would occur in the triac 7B, 8B, 9B of the hybrid circuit 7, 8, 9. At the time t2, in the next half-phase, the semiconductor switch or triac 7B, 8B, 9B of the hybrid circuit 7, 8, 9 is connected through and the associated relay 7A, 8A, 9A is switched off whilst taking into account the relay switch-off delay. At the time t3, the triac 7B, 8B, 9B is switched off again whilst taking into account the short switching delay thereof, in such a way that at the time t4 close to the zero of the corresponding phase L the switch-off process is completed and the load 2 is disconnected from the corresponding phase L. If there is sufficient time between the switch-off command and the next zero, the process takes place in such a way that the switch-off process is ended at the next zero.

In one possible embodiment, various error states or error types are detected or registered as faults by the monitoring unit or error detection unit 20. These faults include for example the corresponding pre-fuse 10, 11, 12 being triggered or the triac or semiconductor switch 7B, 8B, 9B being shorted. This means that the semiconductor switch 7B, 8B, 9B has a defect and is conducting current continuously. Further, the local monitoring unit 20 can register whether internal limit temperatures are being exceeded. In one possible embodiment, each switching unit 7, 8, 9 comprises a temperature sensor which reports the temperature T of the associated switching unit 7, 8, 9 to the local monitoring unit 20. Possible faults, in particular including temperature faults, are preferably reported to the external control system 24 by the internal control system 18 via the interface, and can be optically signalled after the network voltage is switched off.

Figure 4:
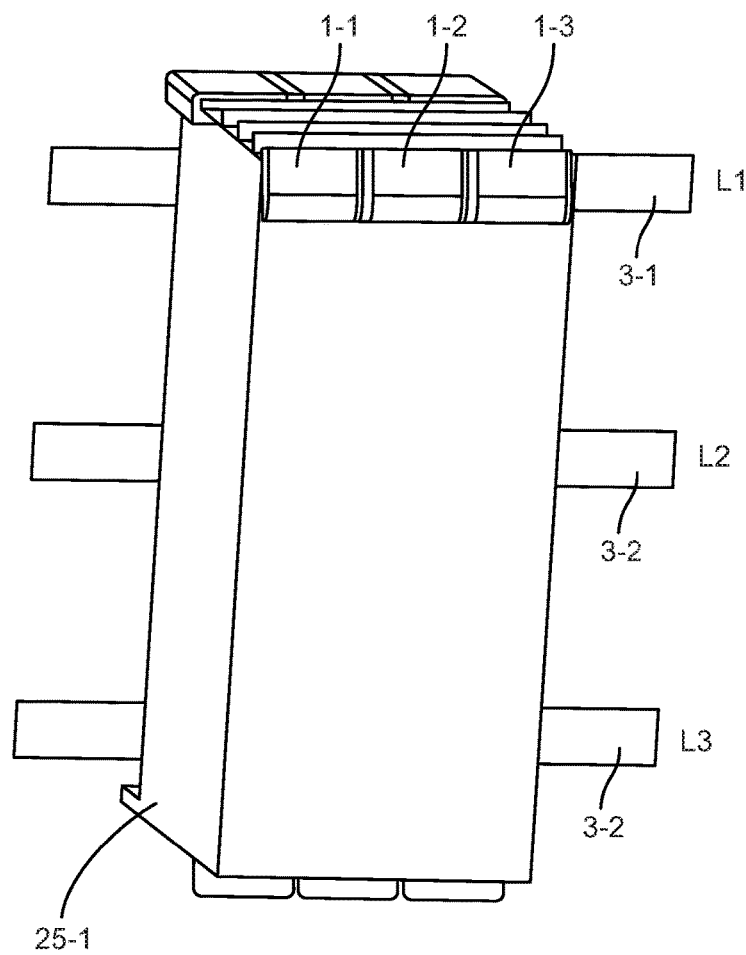
FIG. 4 is a perspective drawing of a busbar system in which a plurality of switching devices for switching loads are provided.

FIG. 4 schematically shows a rail system 3, which comprises three switching devices 1 such as are shown in the block diagram of FIG. 1. The rail system 3 shown in FIG. 4 comprises three busbars 3-1, 3-2, 3-3, which carry three current phases L1, L2, L3. In the embodiment shown, each of the three switching devices 1-1, 1-2, 1-3 comprises three hybrid circuits 7-1, 8-1, 9-1; 7-2, 8-2, 9-2; 7-3, 8-3, 9-3. In total, for example nine load devices or loads 2-$i$ are connectable to the three switching devices 1 shown in FIG. 4. The appliance housing 16-$i$ of the switching device 1 comprises a rail contact system for each current phase L. In the appliance housing, a flap for replacing the safety fuses 10, 11, 12 contained therein may be provided at the side. For the first switching device 1-1, a replacement flap 25-$i$ of this type for replacing the three safety fuses 10, 11, 12 contained therein can be seen at the side in FIG. 4. As can be seen in FIG. 4, the switching arrangement is distinguished by a low space requirement. All connections can take place via plug-in connectors. As loads 2-$i$, for example motors or electric motors, heating elements or lighting elements may be connected. In switching units 7, 8, 9 formed by hybrid circuits, the occurring power loss P in the switching process is very low, and is for example approximately 30% less than for a comparable arrangement which uses solid-state relays. As a result of the lower power loss P and the lower heating associated therewith, the operating time of the switching device 1 is also increased. By way of the switching device 1 according to the invention, it is possible to separate primary operation circuits and control circuits. An independent circuit is provided for each tapped current phase L, all connections being pluggable. The switching device 1 according to the invention is suitable for a rail system comprising an adapter or busbar adapter. The switching device 1 according to the invention can be used for various current-carrying rail systems, in particular for busbar systems or top hat rail systems. In one embodiment, the current measurement units 7C, 8C, 9C comprise GMR sensors. Alternatively, the measurement units 7C, 8C, 9C comprise Rogowski coils, Hall sensors, transformers or shunt measurement resistors.

The switching device 1 according to the invention is suitable for operating at least one load 2-$i$ which is connected to a switching unit 7, 8, 9 of the switching device 1. The switching device 1 can be used for error management and service management in an installation comprising a plurality of loads, and generate a warning message, which can be conveyed for example to a central control system or external control system 24 of the installation, in the event of a failure or a disturbance to a current supply.

Figure 5:
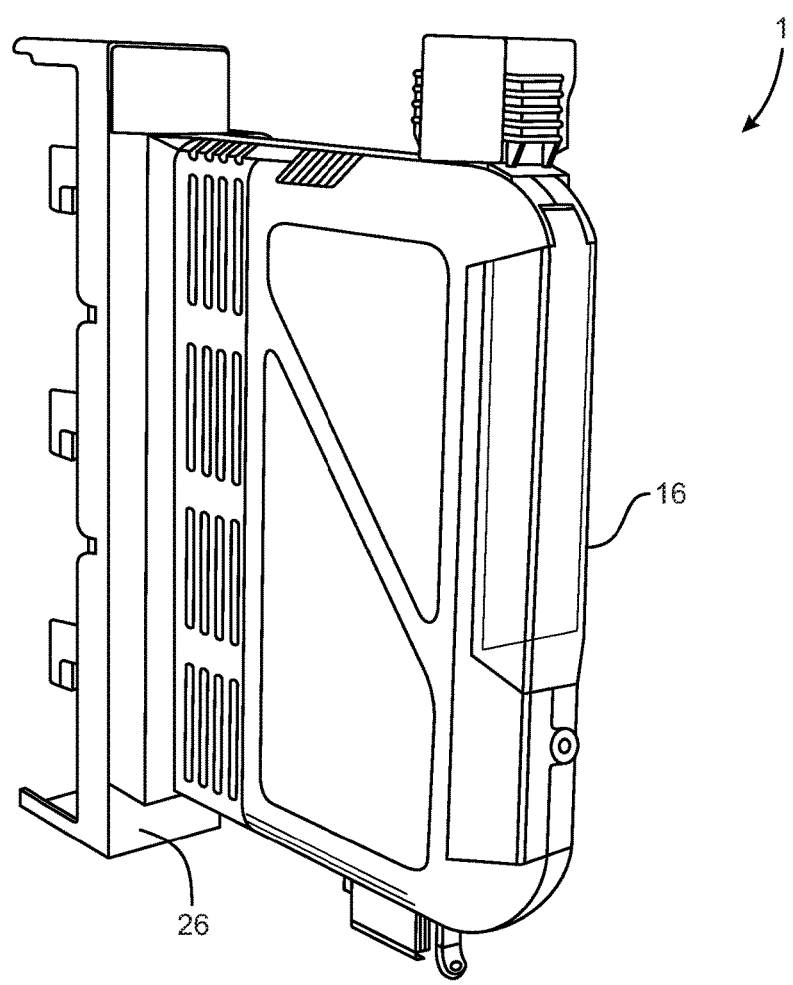
FIG. 5 is a perspective view of an embodiment of the switching device according to the invention.

FIG. 5 is a perspective view of an example embodiment of a switching device 1 according to the invention comprising a housing 16. In the embodiment shown, the housing 16 may be mounted on a rail system by means of a rail adapter 26. In the embodiment shown in FIG. 5, the rail adapter 26 is a busbar adapter for placing on a busbar system. In one possible embodiment, the connection contacts 4, 5, 6 shown in FIGS. 1A, 1B may be connected to corresponding contact systems of the rail adapter 16, for example in that electrical contacts protruding from the housing 16 are plugged into corresponding sockets of the rail adapter 26. In this embodiment, the housing 16 can be plugged into the rail adapter 26, which is in turn mounted on a plurality of busbars 3-1, 3-2, 3-3 of the busbar system 3. In an alternative embodiment, the rail adapter 26 may be integrated into the switching device 1, in other words in this alternative embodiment the rail adapter 26 is formed integrally on the housing 16 of the switching device 1. FIG. 5 merely shows an embodiment of a switching device 1 according to the invention. Alternatively, the switching device 1 may also be provided for other current—carrying rails. It is further possible for the switching device 1 to be attached to a mounting plate or a CrossBoard. It is further possible for the switching device 1 to be mechanically mounted on a top hat rail directly or by means of a mechanical adapter and for electrical connection cables to be connected to electrical connection contacts 4, 5, 6 to supply the current phases L1, L2, L3.

The switching device 1 according to the invention can be used for preventative maintenance of an installation. The local control system 18 of the switching device 1 may for example report a phase failure of a current phase L. Further, the local control system 18 may output a load error or an error of an appliance connected to the switching device 1 to an external control device 24 via an interface. The local control system 18 of the switching device 1 may report both software errors and hardware defects to the external control system 24. The local control system 18 preferably further determines a warning notice if control commands received from the external control 24 have not been carried out or only been carried out in part or been incorrectly carried out by the switching units 7, 8, 9 of the switching device 1. In one possible embodiment, the local control system 18 may report a defective load 2-$i$ connected to the switching device 1 to the external control system 24 via an interface. In a further possible embodiment, the local control system 18 of the external control system may also report an incorrectly connected load 2-$i$. In one possible embodiment, the monitoring unit 20 detects by means of the measurement units 7C, 8C, 9C whether the loads 2-1, 2-2, 2-3 connected to the phase output terminals 13, 14, 15 of the switching device 1 are ohmic, inductive or capacitive loads. In one possible embodiment, the monitoring unit 20 determines a complex resistance Z of the loads 2-1, 2-2, 2-3 connected to the phase output terminals 13, 14, 15 on the basis of the measurements taken by the measurement units 7C, 8C, 9C and reports the determined complex resistance Z of the connected load z-$i$ to the local control system 18 of the switching device 1 and/or via an interface to the external control system 24 of the installation. In one possible embodiment, the monitoring unit 20 monitors a change in the load properties of the connected loads 2-1, 2-2, 2-3, in particular due to wear on the loads during continuous operation of the installation. For example, in one possible embodiment, the change Z(t) in the complex resistance Z of the loads 2-1, 2-2, 2-3 over time can be transmitted by the monitoring unit 20 to the local control system 18 and/or to the external control system 24 of the installation. If for example on the basis of the measurements the calculated complex resistance Z of the loads z-i connected to the switching device 1 is outside an inadmissible operating range, this can be reported to the external control system 24, in such a way that therein preventative maintenance or replacement of the corresponding relevant load 2-$i$ is initiated.

For the switching device 1 according to the invention, there is preferably a separation into primary operation circuits and control circuits. The switching device 1 according to the invention, shown in FIGS. 1A, 1B, makes it possible for example to operate three independent circuits L1, L2, L3 at a current amplitude of for example 25 A. The connections for the loads 2-$i$ and the interfaces 21, 22 preferably comprise plug-in connections.

The switching device 1 according to the invention makes it possible to separate the overload protection and the short circuit protection. The short circuit protection is provided by way of the safety fuses 10, 11, 12, which are preferably operated in a partial-load range. The overload protection is provided by shutting down using the switching functionality found in normal operation, for example if thresholds are exceeded. In one possible embodiment, the switching device 1 according to the invention may be operated automatically by a central external control system. Alternatively, the switching device 1 may also be switched over to manual control. In a further possible embodiment, the local control system 18 may initially output a warning message via an interface in the event of an abnormality in the current supply and generate a fault message if a fault occurs.

In a further possible embodiment of the switching device 1 according to the invention, if a semiconductor switch 7B, 8B, 9B of the switching units 7, 8, 9 fails, time-limited emergency operation takes place.

Figure 6A:
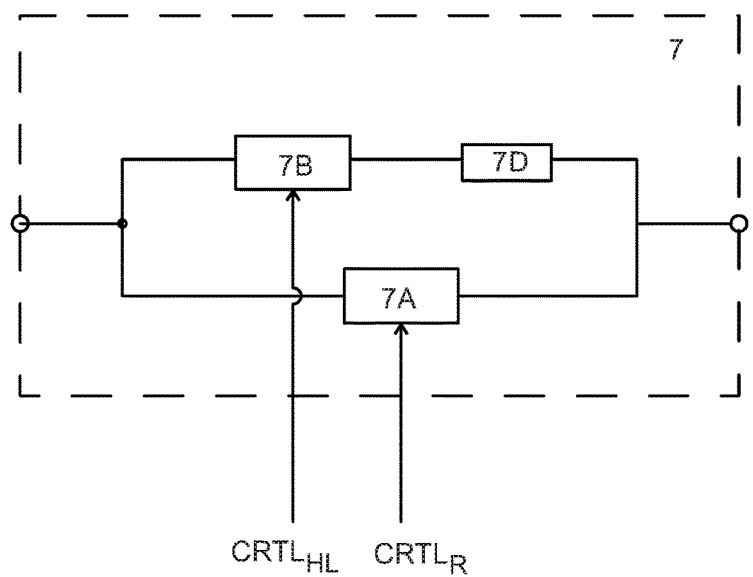
FIGS. 6A, 6B are circuit diagrams of variant configurations of a switching unit contained in the switching device.
Figure 6B:
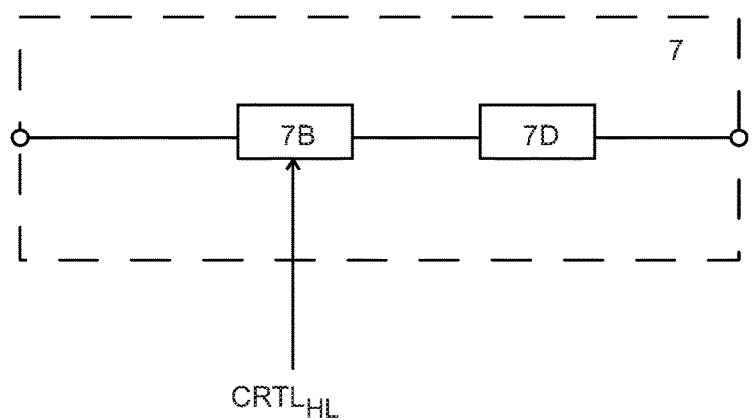

FIG. 6A, 6B are circuit diagrams of variant configurations of a switching unit contained in the switching device 1 according to the invention. FIG. 6A, 6B show variants of the switching unit 7 such as are contained in the switching device 1 according to FIGS. 1A, 1B. The two remaining switching units 8, 9 are of a corresponding construction. In the variant configuration shown in FIG. 6A, the switching units 7 each comprise a mechanical switch 7A and a semiconductor switch 7B connected in parallel therewith. The mechanical switch 7A may for example be formed by a relay. As can be seen from FIG. 6A, the semiconductor switch 7B and the mechanical switch 7A are connected in two parallel current paths and can be actuated separately by the local control unit 18 separately by way of associated control signals CTRL-HL and CTRL-R. In the embodiment shown in FIG. 6A, an additional safety fuse 7D, which makes emergency operation of the load connected to the switching device 1 possible, is formed in the current path of the semiconductor switch 7B, which is formed for example by a triac switch. The safety fuse unit 7D burns for example at a current amplitude of more than 5 amps. If for example the semiconductor switch 7B or the triac short-circuits and subsequently a current flows continuously, the safety fuse 7D connected in series for this purpose short-circuits, in such a way that now a current is only still supplied via the switching relay 7A of the connected load. In the case of for example 20,000 switchings per day, in this way for example thousands of switching processes can still be carried out, and make several weeks of continued emergency operation possible. In one possible embodiment, the monitoring unit 20 detects, by way of corresponding current measurements in the two parallel current paths, that after the safety fuse 7D has burnt out current is no longer flowing in the first current path, whilst the current phase L is still being switched to the connected load via the relay 7A. In this case, the local control system 18 can display an emergency current or emergency operation for the relevant switching unit 7 or the current phase L1 connected thereto, for example via a user interface. If the corresponding safety fuses 8D, 9D on the two remaining switching units 8, 9 burn out, a corresponding emergency operation can also be displayed for the two remaining current phases L2, L3.

The current measurement unit 7C is not shown in the circuit diagram of FIG. 6A. In this context, the current measurement unit 7C can detect currents on one or both of the parallel current paths of the switching unit 7 by way of sensors, for example using GMR sensors connected in one or both of the current paths.

FIG. 6B shows an alternative variants configuration of the switching unit 7, in which it merely comprises one semiconductor switch 7B. In the variant configuration shown in FIG. 1B, the remaining switching units 8, 9 may be constructed analogously. A safety fuse 7D is provided in series with the semiconductor switch 7B, and for example burns out if the semiconductor switch 7B is shorted. As a result, the current supply for the load 2-1 connected to the switching unit 7 is interrupted. In one possible embodiment, the interruption of the current supply for the load 2-1 of the error monitoring unit 20 is displayed by a current measurement unit or current sensor connected in the current path of the switching unit 7. In one possible embodiment, the failure of the current supply for the load 2-1 connected to the phase L1 can be displayed by the local control unit 18 via a user interface.

The monitoring unit 20 can detect further operational deviations from a normal current supply to the loads connected to the switching units 7, 8, 9. For example, the monitoring unit 20 may detect a phase failure of the phase L3. In one possible embodiment, the monitoring units 20 subsequently measures how long the phase failure of the current supply phase lasts. If the corresponding phase failure only lasts a few seconds, this is merely an abnormality which is reported as an abnormality by the local control unit 18 via an interface. However, if the phase failure lasts longer, for example for more than 10 seconds, this may be considered a fault by the local control unit 18. This fault is displayed by the local control unit 18 via a user interface and reported to the external control system 24 as a fault. In this variant configuration, the monitoring unit 20 has a time measurement unit or a counter, by means of which the duration of a sensor-detected phase failure is measured.

A further example of an operational deviation detected by the monitoring unit 20 is a flow of current which still takes place even though the associated load 2-1 has been shut down by way of a control signal. If for example the load 2-2 is shut down and it is established by way of the current measurement unit 8C that current is nevertheless flowing to the shut-down load via the current terminal 14, this may initially be evaluated by the internal control system 18 as an abnormality for a few seconds, in such a way that a corresponding warning message is generated. If the current flows in spite of the associated load being switched off for a longer time, for example for more than 20 seconds, this may be considered a fault by the internal control system 18, said fault triggering a corresponding fault message which is transmitted for example to the external control system 24. In a preferred embodiment, the fault message is also displayed to a user via a user interface of the switching device 1. The displayed or transmitted fault specifies the type of the fault.

For example, the fault message specifies that, in spite of a shut-down load, current is still flowing to the corresponding load via the associated switching unit. A further example of a fault message of this type is that a longer-duration phase failure has been established in a particular phase, for example the phase L3. A further example of a fault message is that the safety fuse (safety fuse 7D) contained in a switching unit has burnt out and thus the corresponding semiconductor switch 7B has presumably shorted. Thus, in one possible embodiment, the fault messages also contain information as to the possible reason for the fault which has occurred, as well as the type of the fault which has occurred. Further, by way of the display unit, instructions for eliminating the faults presumed to have occurred may be displayed to a user. In one possible embodiment, the operational abnormalities and/or faults detected by monitoring unit 20 are displayed and optionally transmitted to the external control system 24 to evaluate the fault.

In one possible embodiment of the switching device 1 according to the invention, the units or components shown in FIGS. 1A, 1B of the switching device 1 are integrated onto a circuit board. In this context, the current-carrying lines are preferably formed by copper paths attached to the circuit board. In one possible embodiment, a current I flowing in the copper paths or lines is measured by the measurement units 7C, 8C, 9C. In one possible embodiment, these are formed by GMR sensors. These GMR sensors may preferably be provided on the opposite or rear face of the circuit board for insulation.

In one possible embodiment, the housing 16 of the switching device 1 comprises ventilation slits. In a further possible embodiment of the switching device 1 according to the invention, at least one ventilation duct is provided on the outer housing wall of the housing 16 of the switching device 1. In one possible embodiment, the switching device 1 according to the invention can be operated in standby. The switching device 1 according to the invention makes cascaded switching of a plurality of appliances possible. The switching device 1 provides an electronic switching appliance having a high useful power output, low power loss, and a high number of electrical switching cycles. The switching device 1 according to the invention can be mounted on a rail system, in particular on a busbar system, in a simple manner. The switching device 1 according to the invention further provides both overload protection and short circuit protection.

In one possible embodiment, the switching device 1 according to the invention additionally comprises a configuration memory. In this configuration memory, particular operating parameters can be configured via an interface. These operating parameters include for example current progressions for a normal current supply to the loads 2-*i* connected to the switching device 1. For example, a preset amplitude and frequency and a signal progression of the connected current phase may be written to the configuration memory of the switching device 1. For example, an amplitude of 240 V for a frequency of 50 Hz and a sinusoidal voltage progression is written to or saved in the configuration memory. Alternatively, other amplitudes, frequencies or voltage progressions may also be stored in the configuration memory of the switching device 1. The monitoring unit 20 preferably has access to the configuration memory. In one possible embodiment, the monitoring unit 20 compares the current phase progression L(t) outputted to the loads 2-*i*, as measured by the measurement units 7C, 8C, 9C, with the current supply progression saved in the configuration memory. If there is any deviation, it can be reported by the monitoring unit 20 of the internal local control system 18 to the switching device 1 and/or to the external control system 24 of the installation.

The invention claimed is:

1. A switching device for operating at least one load, comprising:
   at least one switching unit, configured and operable to switch a tapped current phase to a load connectable to the switching unit to supply said load with current, the switching unit including a measurement unit which measures a current phase progression of the at least one current phase;
   a local control system configured and operable to, after receiving a control command from an external control system, actuate a semiconductor switch of the switching unit in such a way that the semiconductor switch switches at a zero of the current phase measured by the measurement unit; and
   a local monitoring unit, configured and operable to evaluate the current phase progression, measured by the measurement unit, of the at least one current phase to detect an operational deviation from a normal current supply to the respective load connected to the switching unit, and to report any detected operational deviation.

2. The switching device according to claim 1, wherein the at least one switching unit is formed by a hybrid circuit, wherein the hybrid circuit comprises a mechanical switch and a semiconductor switch connected in parallel therewith.

3. The switching device according to claim 1, wherein the switching device comprises at least one current measurement unit configured and operable to monitor the progression over time of at least one tapped current phase.

4. The switching device according to claim 3, wherein the current measurement unit is configured and operable to detect a zero of the tapped current phase and to report the zero of the tapped current to the local control system of the switching device.

5. The switching device according to claim 1, wherein the local monitoring unit is configured and operable to monitor whether the tapped current phase has been outputted by the switching unit in accordance with the control command received by the local control system from an external control system.

6. The switching device according to claim 1, wherein:
   the local monitoring unit is configured and operable to a switching error which has occurred and reports it to the local control system of the switching device, and
   the local control system of the switching device is configured and operable to pass a switching error reported thereby to an external control system via an interface.

7. The switching device according to claim 1, wherein the tapped current phase is passed to the switching unit via a replaceable safety fuse.

8. The switching device according to claim 1, wherein, if a switching error occurs, the local monitoring unit is configured and operable to detect the type of the switching error which has occurred and to report the type of the switching error which has occurred to the local control system of the switching device.

9. The switching device according to claim 8, wherein the local monitoring unit is configured and operable to detect whether the switching error which has occurred is the cause of a failure of a tapped current phase or of a continuous current outputted by the switching unit.

10. The switching device according to claim 9, wherein the local control system is configured and operable to pass the reported type of the switching error which has occurred on to the external control system via an interface, wherein the external control system is configured and operable to evaluate the switching errors reported by the local control system of the switching device and/or the type thereof and to drive the loads connected to the switching device in accordance with the evaluation result.

11. The switching device according to claim 1, wherein the switching device comprises at least one temperature sensor configured and operable to monitor an internal temperature of the at least one switching unit, within the switching device and to report the internal temperature to the local control system of the switching device.

12. The switching device according to claim 6, wherein the interface of the switching device is connected to the external control system via at least one optical coupler.

13. The switching device according to claim 2, wherein:
the mechanical switch of one of the at least one switching unit is formed as a hybrid circuit comprises a relay, and
the semiconductor switch of the one of the at least one switching unit is formed as a hybrid circuit comprises a triac.

14. The switching device according to claim 1, wherein the switching device comprises three switching units for three tapped current phases, wherein each of the three switching units includes a mechanical relay and a triac connected in parallel with the mechanical relay.

15. The switching device according to claim 1, wherein:
the entire switching device is integrated into an appliance housing or in each case a corresponding one of the at least one switching unit and an associated local control system are integrated into a separate appliance housing, and
the appliance housing of the switching device comprises an associated rail contact system for each current phase.

16. The switching device according to claim 1, wherein:
an external control system is connectable to the at least one local control system of the switching device via a plug-in connection, and
wherein the at least one load is connectable to a switching unit of the switching device via a plug-in connection.

17. The switching device according to claim 1, wherein the switching device is synchronized with a power network.

18. The switching device according to claim 3, wherein the current measurement unit comprises a GMR sensor, a Rogowski coil, a transformer, a Hall sensor or a shunt measurement resistor.

19. The switching device according to claim 1, wherein the switching device is mountable on a top hat rail or a mounting plate.

20. The switching device according to claim 1, wherein the switching device comprises at least one reversing stage.

21. A rail system comprising:
a plurality of rails for current phases and
at least one switching device according to claim 1, which is connected to the rails via rail contact systems to tap the current phases,
wherein a load is connectable to each switching unit of the switching device.

22. The rail system according to claim 21, wherein the rail system comprises a busbar system having a plurality of busbars arranged parallel.

* * * * *